(12) United States Patent
Egawa

(10) Patent No.: US 6,353,537 B2
(45) Date of Patent: *Mar. 5, 2002

(54) STRUCTURE FOR MOUNTING RADIATING PLATE

(75) Inventor: Satoshi Egawa, Kawasaki (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/461,022

(22) Filed: Dec. 15, 1999

(30) Foreign Application Priority Data

Dec. 17, 1998  (JP) ............................................ 10-358921

(51) Int. Cl.⁷ ................................................ H05K 7/20
(52) U.S. Cl. ...................... 361/704; 165/80.2; 165/185; 257/719; 361/710; 361/719; 248/505; 248/510
(58) Field of Search ................................ 165/80.2, 80.3, 165/185; 174/16.3; 257/706–707, 712–713, 718–719, 726–727; 361/707, 709–710, 715, 719–720; 248/505, 510

(56) References Cited

U.S. PATENT DOCUMENTS

| 5,615,735 A | * | 4/1997 | Yoshida et al. ............. 257/719 |
| 5,640,305 A | * | 6/1997 | Smithers ..................... 361/719 |
| 5,734,556 A | * | 3/1998 | Saneinejad et al. ......... 361/719 |

* cited by examiner

Primary Examiner—Gregory Thompson
(74) Attorney, Agent, or Firm—Fitzpatrick, Cella, Harper & Scinto

(57) ABSTRACT

A radiating-plate mounting structure for mounting a radiating plate on a semiconductor integrated circuit installed on a printed circuit board is arranged to have a pin disposed on the printed circuit board in the neighborhood of the semiconductor integrated circuit and to fix the radiating plate to the semiconductor integrated circuit by pressing the radiating plate with a spring member using a lock part of the pin as a fulcrum. At this time, the middle part of the radiating plate can be reliably fixed to the semiconductor integrated circuit by a hole provided in the spring member for allowing a fin part of the radiating plate to escape through the hole. The structural arrangement effectively eliminates the possibility of having the radiating plate caused to peel off by some impact inflicted thereon.

2 Claims, 6 Drawing Sheets

US 6,353,537 B2

STRUCTURE FOR MOUNTING RADIATING PLATE

BACKGROUND OF THE INVENTION

1. Field of the Invention

The present invention relates to a structure for mounting a radiating plate which is provided on a semiconductor integrated circuit to be installed in a printed circuit board.

2. Description of Related Art

Semiconductor integrated circuits have recently come to be prepared to have a high degree of density. As a result, the heat build-up amount of flat-package-type semiconductor integrated circuits is trending upward. It has become difficult to sufficiently lower the temperature of these semiconductor integrated circuits by natural cooling. The semiconductor integrated circuits, however, must be cooled, because exposing them to high temperature tends to cause them to malfunction.

Known methods for cooling the flat-package-type semiconductor integrated circuits include air cooling by mounting a radiating plate (a heat sink), forcible cooling with a cooling fan, and cooling by Peltier effect attained with a Peltier element.

The methods of using a cooling fan or a Peltier element give an excellent cooling effect. However, these methods have necessitated securing a power source for operating the cooling fan or the Peltier element and also have incurred an inevitable increase in cost due to the addition of the cooling fan or the Peltier element.

The method of mounting a radiating plate permits cooling the semiconductor integrated circuit at a lower cost than the methods of using a cooling fan or a Peltier element. For mounting the radiating plate on the flat-package-type semiconductor integrated circuit, it has been practiced to secure the radiating plate to the semiconductor integrated circuit by bonding with an adhesive, a double-sided adhesive tape or the like.

However, in cases where a shake or a downfall happens to inflict an impact on the radiating plate which is bonded with an adhesive, the bonded part of radiating plate tends to peel off. In such a case, the radiating plate would part from the semiconductor integrated circuit, becoming incapable of fulfilling its cooling function.

BRIEF SUMMARY OF THE INVENTION

The present invention is directed to the solution of the above-stated problem of the prior art. An object of the invention is, therefore, to provide a structure for mounting a radiating plate on a semiconductor integrated circuit in such a way as to ensure that the radiating plate is never caused to peel off by any impact inflicted thereon.

To attain the above object, in accordance with an aspect of the invention, there is provided a radiating-plate mounting structure, comprising, a printed circuit board, a semiconductor integrated circuit installed on the printed circuit board, a radiating plate provided on the semiconductor integrated circuit, and spring urging means for pressing and fixing the radiating plate onto the semiconductor integrated circuit.

The above and other objects and features of the invention will become apparent from the following detailed description of preferred embodiments taken in connection with the accompanying drawings.

BRIEF DESCRIPTION OF THE SEVERAL VIEW OF THE DRAWING

Figure 1:
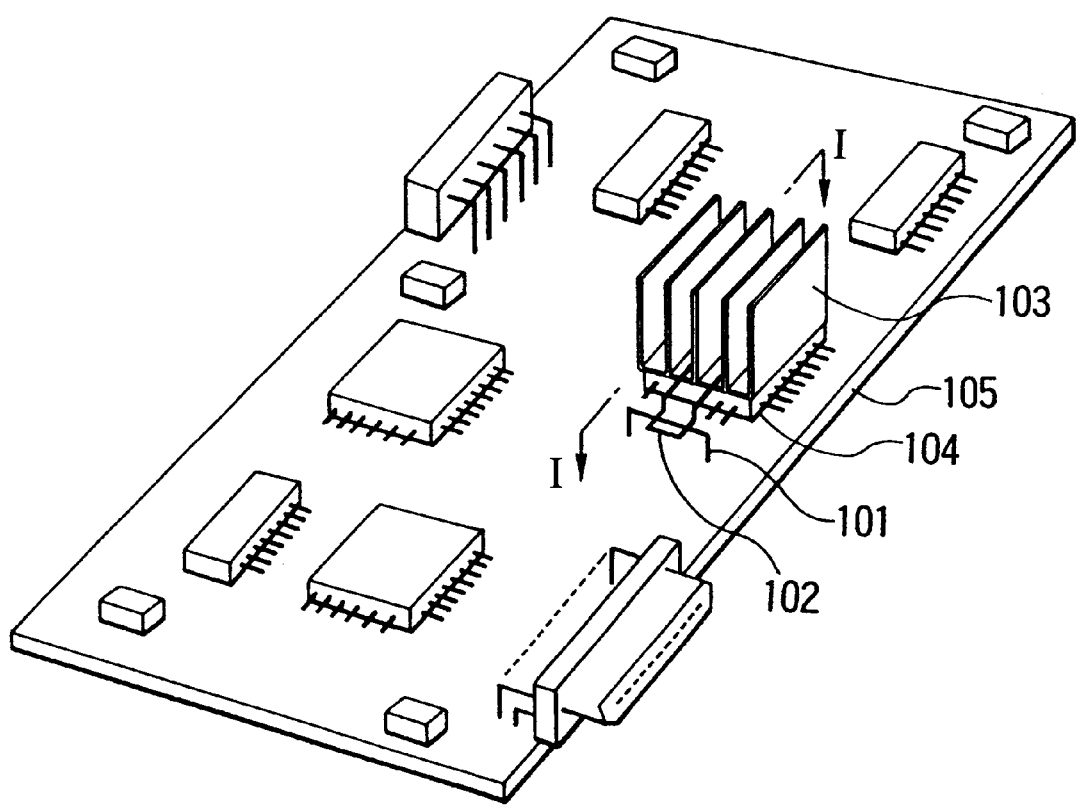
FIG. 1 is a perspective view showing a printed circuit board on which a semiconductor integrated circuit to which a radiating plate is fixed is mounted, according to a first embodiment of the invention.
Figure 3A:
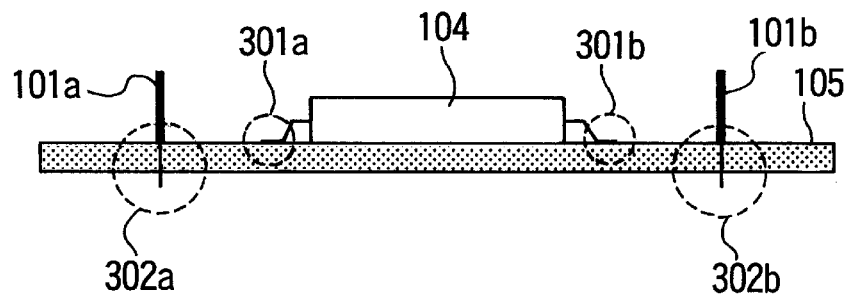
Figure 3B:
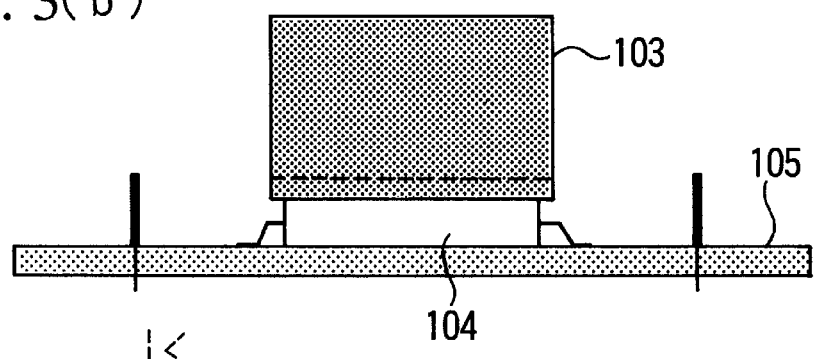
Figure 3C:
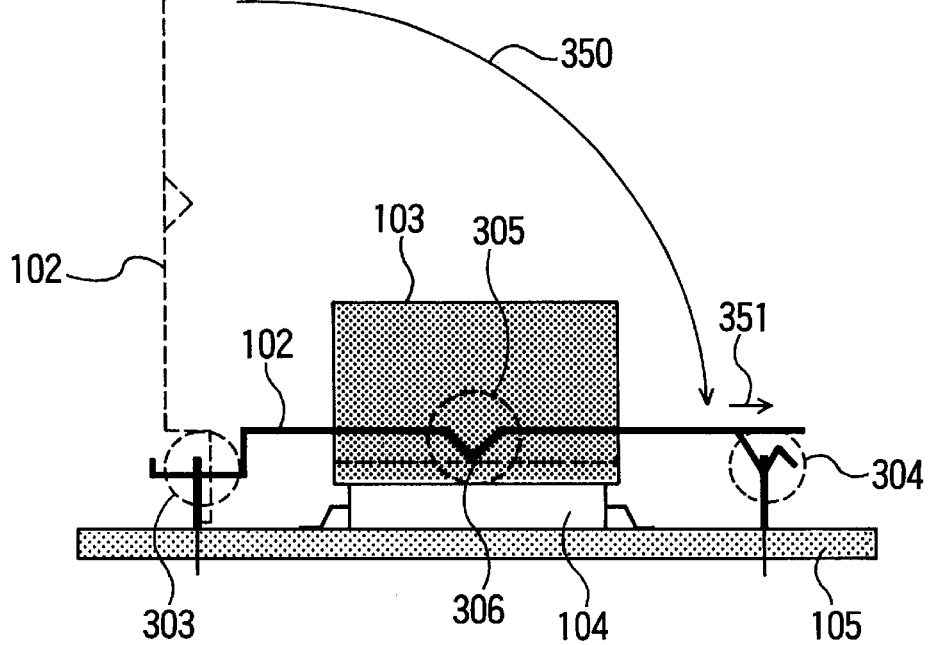

FIGS. 3(a), 3(b) and 3(c) are diagrams for explaining procedures for mounting pins, a QFPIC (flat-package-type semiconductor integrated circuit), a radiating plate and a spring member shown in FIG. 1.

Figure 2:
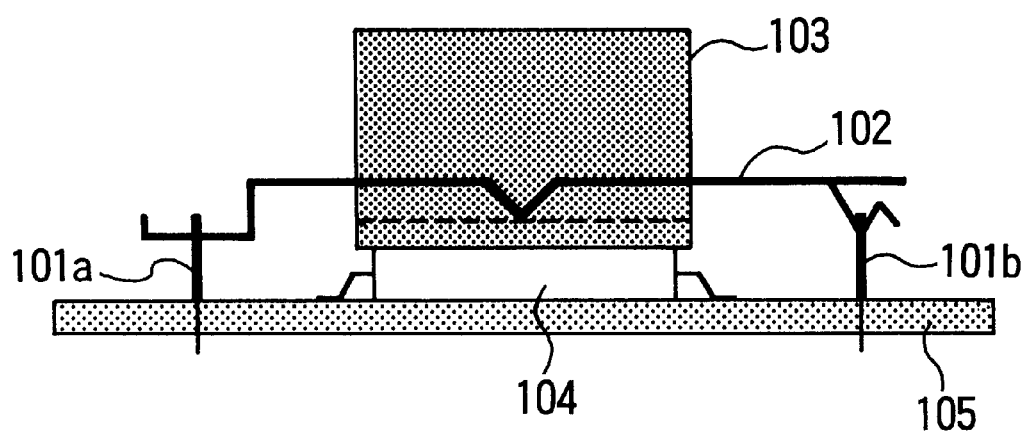
FIG. 2 is a sectional view showing a radiating-plate mounting part shown in FIG. 1.
Figure 4:
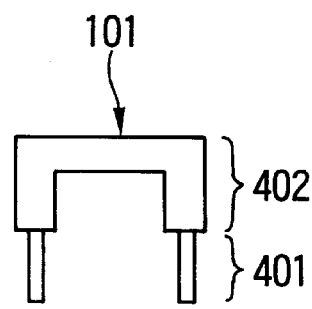

FIG. 4 is a plan view showing the pin shown in FIG. 2.

Figure 5A:
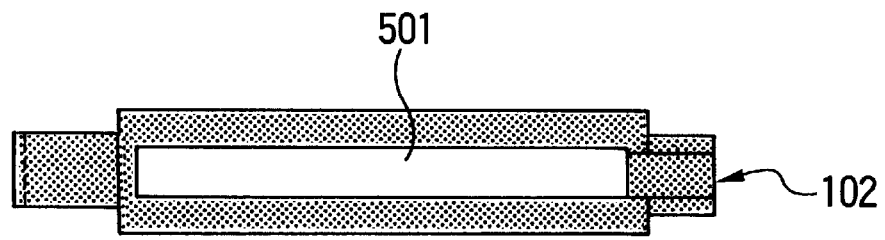
Figure 5B:
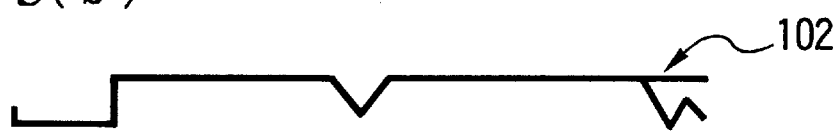

FIGS. 5(a) and 5(b) are a plan view and a front view, respectively, showing the spring member shown in FIG. 2.

Figure 6A:
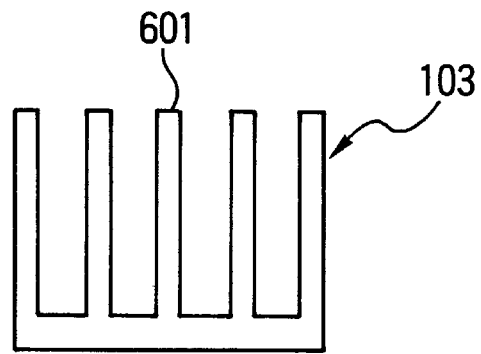
Figure 6B:
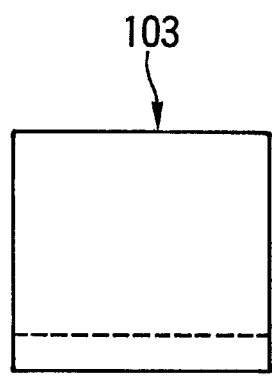

FIGS. 6(a) and 6(b) are a side view and a front view, respectively, showing the radiating plate shown in FIG. 2.

Figure 7:
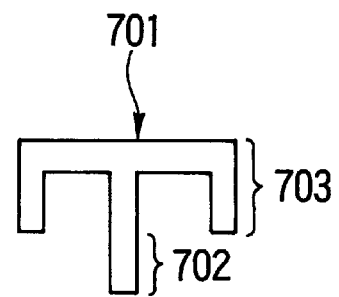

FIG. 7 is a plan view showing a pin whose shape is different from that of the pin shown in FIG. 4, according to a second embodiment of the invention.

Figure 8A:
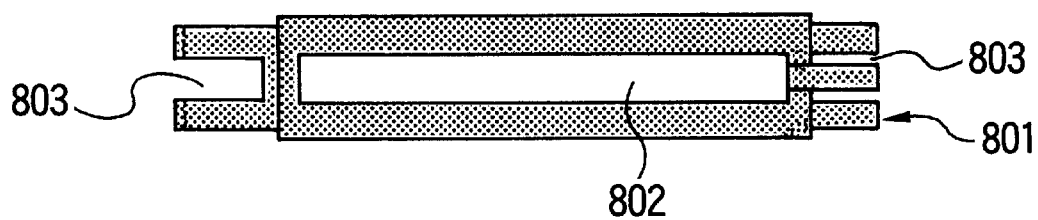
Figure 8B:
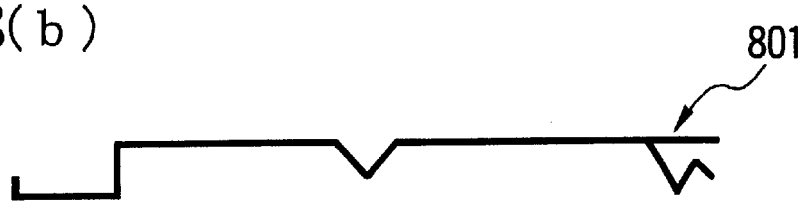

FIGS. 8(a) and 8(b) are a plan view and a front view, respectively, showing a spring member arranged in combination with the pin shown in FIG. 7.

DETAILED DESCRIPTION OF THE INVENTION

Hereinafter, preferred embodiments of the invention will be described in detail with reference to the drawings.

First, a first embodiment of the invention is described with reference to FIG. 1 to FIGS. 6(a) and 6(b). FIG. 1 shows a printed circuit board on which a semiconductor integrated circuit to which a radiating plate is fixed is mounted. In FIG. 1, there are illustrated a pin 101 which is formed approximately in a U shape, a spring member 102, a radiating plate 103 (or a heat sink), a flat-package-type semiconductor integrated circuit 104 (hereinafter referred to as QFPIC), and a printed circuit board 105.

FIG. 2 is a sectional view taken along a line I—I in FIG. 1 to show a mount part where the radiating plate 103 is mounted. Referring to FIG. 2, metal pins 101a and 101b each of which is formed approximately in a U shape are soldered to the printed circuit board 105. The radiating plate 103 is fixed to the QFPIC 104 in a state of being pushed to the QFPIC 104 by the urging force of the spring member 102 with the upper sides of the metal pins 101a and 101b used as fulcra.

FIGS. 3(a), 3(b) and 3(c) are diagrams for explaining procedures for mounting the approximately-U-shaped pins 101, the QFPIC 104, the radiating plate 103 and the spring member 102.

Referring to FIG. 3(a), the approximately-U-shaped metal pins 101a and 101b are fixed by soldering to the printed circuit board 105 at through-hole parts 302a and 302b thereof. The QFPIC 104 has its lead wire parts soldered to the printed circuit board 105 at its parts 301a and 301b. The soldering is performed by the same process by which other parts are fixed by soldering to the printed circuit board 105. With the printed circuit board 105 designed to have the through-hole parts 302a and 302b connected at this time to the signal ground of the printed circuit board 105, the soldered approximately-U-shaped pins 101a and 101b are connected to the signal ground of the printed circuit board 105.

Referring to FIG. 3(b), next, the radiating plate 103 is temporarily fixed to the QFPIC 104 with an adhesive, a double-sided adhesive tape or the like. The adhesive or the double-sided adhesive tape to be used at that time, of course, must have a good thermal conductivity.

Referring to FIG. 3(c), next, the spring member 102 is mounted in such a way as to push the radiating plate 103 against the QFPIC 104 with the approximately-U-shaped pins 101a and 101b used as fulcra. The radiating-plate mounting steps are as follows. The spring member 102 is first set in an approximately vertical posture to have its one end 303 in touch with the approximately-U-shaped pin 101a. Then, the spring member 102 is swung in this state in the direction of an arrow 350. At this time, a fin 601 which is formed at the center of the radiating plate 103 as shown in FIG. 6(a) comes into a hole 50 provided in the center part of the spring member 102 as shown in FIG. 5(a), so that the spring member 102 is prevented from colliding with the radiating plate 103. With the swinging motion of the spring member 102 made further, when the spring member 102 comes to be approximately in parallel to the printed circuit board 105, the tip 306 of a V-shaped part 305 provided in the center part of the spring member 102 comes to abut on the radiating plate 103. Then, the spring member 102 is further swung in a pushing manner until the other end 304 thereof comes to touch the approximately-U-shaped pin 101b. After that, the spring member 102 is slid in the direction of an arrow 351 (to the right as viewed in FIG. 3(c)). In this state, a pushing force is exerted on the radiating plate 103 at the tip 306 of the V-shaped part 305 of the spring member 102.

FIG. 4 is a plan view showing each of the approximately-U-shaped pins 101 (101a and 101b) used in the first embodiment. Referring to FIG. 4, the pin 101 is soldered to the printed circuit board 105 by inserting parts 401 of the pin 101 into through holes of the printed circuit board 105. Parts 402 of the pin 101 serve to keep a predetermined distance of clearance between the printed circuit board 105 and the upper side of the pin 101 which acts as a fulcrum. The approximately-U-shaped pin 101 is formed with a hard metal.

FIG. 5(a) is a plan view of the spring member 102 used in the first embodiment. FIG. 5(b) is a front view of the spring member 102. The spring member 102 is made of an elastic metal and is provided with a hole 501 in its middle part for allowing a fin part of the radiating plate 103 to escape therethrough.

FIG. 6(a) is a side view of the radiating plate 103 used in the first embodiment. FIG. 6(b) is a front view of the radiating plate 103. The radiating plate (heat sink) 103 excels in thermal conductivity and is made of a light metal such as aluminum or the like. To enhance its efficiency of cooling, the radiating plate 103 is provided with a plurality of fins 601.

In the arrangement described above, the approximately-U-shaped pins 101a and 101b are soldered to the QFPIC 104 at positions on both sides thereof. With the approximately-U-shaped pins 101a and 101b used as fulcra, the radiating plate 103 is fixed to the QFPIC 104 in a state of being pressed against the QFPIC 104 by the spring member 102.

Further, the spring member 102 can be readily dismounted and removed according to procedures which are reverse to the mounting procedures described above. Therefore, the QFPIC 104 which is soldered can be easily replaced.

According to the invention, each metal pin which is soldered to the printed circuit board 105 does not have to be in the approximate U shape. The metal pin may be arranged in any other suitable shape as long as the pin is provided with some lock part. FIG. 7 shows in a plan view an E-shaped pin 701 which is employed in a second embodiment of the invention. Referring to FIG. 7, the E-shaped pin 701 has a leg part 702 at which the pin 701 is soldered to the printed circuit board 105 with the leg part 702 inserted into a through hole formed in the printed circuit board 105. Parts 703 of the pin 701 are arranged to maintain a predetermined distance of clearance between the printed circuit board 105 and the upper side of the pin 701 which is used as a fulcrum after the pin 701 is soldered to the printed circuit board 105.

FIG. 8(a) is a plan view of a spring member 801 which is arranged according to the shape of the E-shaped pin 701. FIG. 8(b) is a front view of the spring member 801. Since the pin 701 has the leg part 702 formed at the center thereof, a cut-in part 803 is provided in each end of the spring member 801 for preventing the spring member 801 from touching the center leg part 702 of the pin 701. Further, as in the first embodiment, the spring member 801 has a hole 802 formed in its middle part for allowing the fin of the radiating plate 103 to escape therethrough.

The procedures for mounting the parts of the second embodiment described above are identical with the mounting procedures of the first embodiment and are, therefore, omitted from the description. Although the second embodiment has the E-shaped pin 701 and the spring member 801 arranged as described above, the E-shaped pin 701 is soldered to a position on each of two sides of the QFPIC 104 and the spring member 801 is mounted thereon. With the spring member 801 thus mounted, the radiating plate 103 can be fixed in position in a state of being pushed against the QFPIC 104 as in the case of the first embodiment.

According to the invention, as described in the foregoing, the radiating plate, i.e., a heat sink, which is mounted on the semiconductor integrated circuit is fixed in position with a spring member. Therefore, the radiating plate, i.e., the heat sink, is never caused to peel off the semiconductor integrated circuit by vibrations or shakes nor by a downfall impact inflicted thereon.

In replacing the semiconductor integrated circuit on which the radiating plate is mounted, the replacing work can be easily carried out as the spring member and the radiating plate are removable without difficulty.

Further, since the heat sink can be connected to the signal ground through the metal pin and the spring member, radiant noises of the semiconductor integrated circuit can be adequately suppressed.

What is claimed is:

1. A semiconductor integrated circuit structure comprising:

(a) a printed circuit board for connecting circuit elements;

(b) a semiconductor integrated circuit installed on said printed circuit board;

(c) a metal radiating plate provided on said semiconductor integrated circuit, said radiating plate having a plurality of fins;

(d) a metal spring member which is formed with a V-shaped tip part and is provided with a hole for allowing at least one of the plurality of fins of said radiating plate to escape through said hole, said tip part pressing and fixing said metal radiating plate to said semiconductor integrated circuit; and (e) a metal pin member which is attached to said printed circuit board and which supports said metal radiating plate on said printed circuit board by spring force of said spring member.

2. A semiconductor integrated circuit structure according to claim 1, wherein said V-shaped tip part is formed in a center part of said metal spring member, said radiating plate has a base member and with said plurality of fins vertically extending from said base member, and said spring member presses and fixes said base member of said radiating plate on said semiconductor circuit.

* * * * *